United States Patent
Ruffieux

(10) Patent No.: US 6,956,443 B2
(45) Date of Patent: Oct. 18, 2005

(54) DIFFERENTIAL OSCILLATOR CIRCUIT INCLUDING AN ELECTRO-MECHANICAL RESONATOR

(75) Inventor: David Ruffieux, Belfaux (CH)

(73) Assignee: CSEM Centre Suisse D'Electronique Et De (CH)

( * ) Notice: Subject to any disclaimer, the term of this patent is extended or adjusted under 35 U.S.C. 154(b) by 152 days.

(21) Appl. No.: 10/668,318

(22) Filed: Sep. 24, 2003

(65) Prior Publication Data

US 2004/0130404 A1 Jul. 8, 2004

Related U.S. Application Data

(63) Continuation-in-part of application No. 10/162,714, filed on Jun. 6, 2002, now Pat. No. 6,696,899.

(30) Foreign Application Priority Data

Jun. 7, 2001 (EP) .............................. 01202173

(51) Int. Cl.[7] .............................................. H03B 5/32
(52) U.S. Cl. ................................ 331/158; 331/116 FE; 331/116 R; 331/107 A; 331/175
(58) Field of Search ............................ 331/158, 116 R, 331/107 A, 175, 116 FE

(56) References Cited

U.S. PATENT DOCUMENTS

| | | | |
|---|---|---|---|
| 4,588,968 A | 5/1986 | Wile | |
| 5,469,116 A | 11/1995 | Slemmer | |
| 5,999,062 A | 12/1999 | Gilbert | |
| 6,525,609 B1 | 2/2003 | Behzad | |
| 6,798,304 B2 * | 9/2004 | Gomez | 331/116 FE |

FOREIGN PATENT DOCUMENTS

| | | |
|---|---|---|
| DE | 43 31 499 A1 | 3/1995 |
| EP | 335 493 A2 | 10/1989 |
| WO | WO 98/48511 A1 | 10/1998 |

OTHER PUBLICATIONS

David Ruffieux, "A High–Stability, Ultra–Low–Power Differential Oscillator Circuit for Demanding Radio Applications", RF and Analog IC's Microelectronic Division, Neuchatel Switzerland, ESSCIRC 2002 Conference, Sep. 24–26, 2002, pp. 85–88.
Resonance–Mode Selection and Crosstalk Elimination Using Resonator–Synchronised Relaxaion Oscillators by J.R. Westra et al, Delft University of Technology, Faculty of Information Technology and Systems, pp. 88–91, Sep. 1998.

* cited by examiner

Primary Examiner—Arnold Kinkead
(74) Attorney, Agent, or Firm—Sughrue Mion, PLLC

(57) ABSTRACT

A differential oscillator circuit including first (10) and second (20) branches each including the series arrangement, between high (VDD) and low (VSS) supply potentials, of a transistor (4, 5) and bias means (2, 3, 8, 9) for imposing a determined current through the current terminals of the transistor. The transistors are interconnected so as to form a crossed pair of transistors, the most positive current terminal of each transistor (on the "drain" side) being connected to the control terminal of the other transistor of the crossed pair. This differential oscillator circuit further includes an electro-mechanical resonator (6) connected to the crossed transistor pair on the "drain" side, as well as a capacitive element (7) connected to the crossed transistor pair on the "source" side. The capacitance value of the capacitive element is selected so as to be less than a maximum value above which relaxation of the oscillator circuit can occur and thereby prevent relaxation of the oscillator circuit.

14 Claims, 3 Drawing Sheets

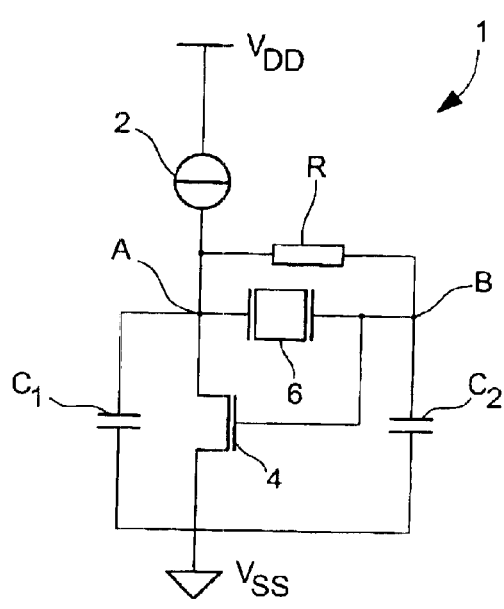
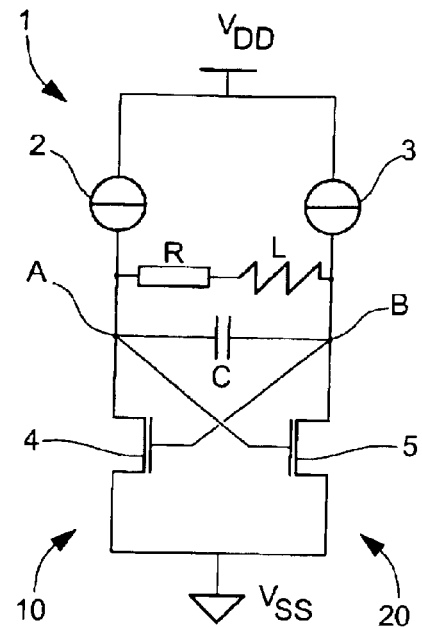
Fig.1a
(PRIOR ART)
Fig.1b
(PRIOR ART)
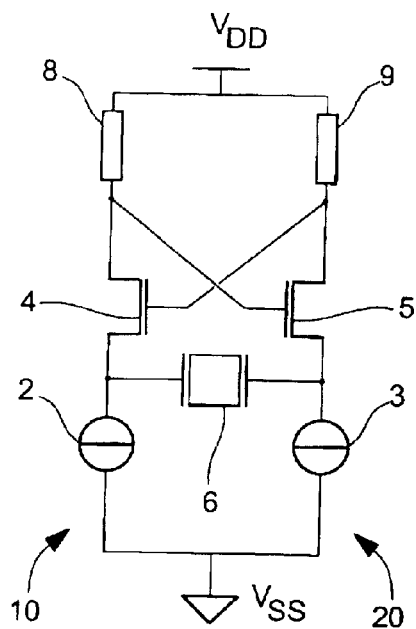
Fig.1c
(PRIOR ART)

DIFFERENTIAL OSCILLATOR CIRCUIT INCLUDING AN ELECTRO-MECHANICAL RESONATOR

RELATED APPLICATION

This application is a continuation-in-part of U.S. patent application Ser. No. 10/162,714 filed on Jun. 6, 2002 and now U.S. Pat. No. 6,696,899 in the name of David Ruffieux and entitled "Differential oscillator circuit including an electro-mechanical resonator" which is assigned to the present Assignee.

TECHNICAL FIELD

The present invention generally concerns a differential oscillator circuit including an electro-mechanical resonator, in particular for an application as a timekeeper or precise reference frequency or in the field of telecommunications.

BACKGROUND ART

Oscillator circuits are used in two main application categories. One of these applications is as a timekeeper or clock signal generator and the other is as a circuit for making signal frequency translation possible in telecommunication devices.

Electro-mechanical resonators, such as quartz resonators, are used, so to speak, systematically in applications as time-keeper, requiring a precise time base or when a precise reference frequency is desired, whereas the oscillator circuits used in radio-transmitters generally use LC tank circuits. The limited stability of the latter and the large dispersion of their constitutive components often mandates their frequencies being slaved to a precise reference obtained from a crystal oscillator through a phase lock loop. There is no substantial difference in the circuits associated with these two. types of resonators.

In today's battery operated low power radio systems optimised for low bit-rate communications with duty cycles typically below a few percents, a crystal oscillator has to run in permanence to maintain synchronization and organize a periodic wake-up of the system. The power consumption of this oscillator and its associated division chain is thus a critical parameter since, together with the leakage current of snoozed circuitry (e.g. RAM, μP), it sets the static consumption of the radio system. On the other hand, highly sensitive radio systems require a very accurate and stable time base since an emitter/receiver pair has to synthesize frequencies differing by no more than a few ppm so that a narrowband communication channel can be established. Consequently, such systems require two time bases, a low power one (typically a 32 kHz time base as encountered in wristwatches) that runs permanently and ensures the period wake-up of the radio, and another one relying on a very accurate radio crystal running intermittently but unfortunately at a much higher frequency and thus consuming a lot more power. This arrangement presents however several drawbacks, namely (i) the fact that two external bulky crystals are required, (ii) the fact that the limited precision of the 32 kHz time base implies more frequent wake-up or longer preamble thus increasing the duty cycle of the radio, and (iii) the fact that the accurate time base needs to be powered up for each wake-up thus requiring an extra power consumption and degrading the resonator ageing.

FIG. 1a shows a low consumption oscillator circuit 1 including a quartz resonator typically used in applications as timekeeper or frequency reference. The simplicity and high stability of this oscillator circuit have made it the most popular crystal oscillator structure for low-power time bases found typically in wristwatch applications and for precise frequency reference for radio systems. This oscillator circuit 1, also known as a Pierce oscillator circuit or three-points oscillator circuit, thus includes a branch comprising a series arrangement, starting from a supply potential VDD to a supply potential VSS forming ground, of a current source 2 and a MOS transistor 4 connected via its drain terminal to current source 2 and via its source terminal to potential VSS. A quartz resonator 6 and a resistive element R are connected in parallel between the connection node, indicated by the reference A, of current source 2 and transistor 4, and the connection node, indicated by the reference B, connected to the gate terminal of transistor 4. First and second load capacitive elements C1 and C2 are respectively connected, via one of their electrodes, to connection nodes A and B, the other electrode being connected to supply potential VSS.

A linear analysis of the impedance presented by the circuit of FIG. 1a including the static capacitance of the resonator, $C_O$, leads to a bilinear function of the transconductance gm and thus a circle in the complex plane that allows the determination of the oscillator critical current, the exact frequency of oscillation, its sensitivity to quality factor Q, losses and loading capacitance variations and the maximum start-up current (cf. in particular E. A. Vittoz, M. G. R. Degrauwe and S. Bitz, "High-Performance Crystal Oscillator Circuits: Theory and Application", JSSC, Vol. 23, No. 3, June 1988, pp. 774–783). To obtain a large circle radius and hence high stability, large loading capacitors are required thus increasing the oscillator power consumption.

If the circuit structure of the 3-points oscillator is duplicated and rendered symmetrical, the cross-coupled pair familiar to differential LC oscillator is obtained. Such a configuration is shown in FIG. 1b. In this example, the circuit uses an LC tank circuit. This oscillator circuit, also globally indicated by the reference numeral 1, includes, placed in parallel between supply potentials VDD and VSS, first and second branches 10, 20 each including a series arrangement of a current source 2, respectively 3, and a transistor 4, respectively 5, connected by its drain terminal to the current source and via its source terminal to potential VSS. The LC tank circuit includes a capacitive element C placed in parallel to the series arrangement of a resistive element R, generally symbolising the arrangement losses, and an inductive element L.

Transistors 4 and 5 are connected in a differential configuration so as to form a crossed pair, i.e. the gate terminal of each transistor is connected to the drain terminal of the other transistor. Connection node A is thus formed of the connection node between current source 2, the drain terminal of transistor 4 and the gate terminal of transistor 5, and connection node B is formed of the connection node between current source 3, the drain terminal of transistor 5 and the gate terminal of transistor 4. The LC tank circuit is thus placed, in a similar manner to the quartz resonator of FIG. 1a, between connection nodes A and B of the oscillator circuit, on the side of the drain terminals of transistors 4 and 5.

The differential structure of FIG. 1b offers substantial advantages for high frequency applications, such as, particularly, reduced sensitivity to the supply and substrate noise, reduced harmonic pair content and limited substrate current injection.

The circuit implementation of FIG. 1b is however not suitable for a resonator exhibiting a high DC impedance such as a crystal resonator since the circuit will merely latch in one of its two stable state, preventing a further oscillation build-up.

Differential oscillator circuit embodiment attempts using an electro-mechanical resonator have been proposed but have not, as yet, led to satisfactory solutions, mainly for reasons of stability. FIG. 1c shows, for example, the prototype of a differential oscillator circuit employing a quartz resonator developed for the first electronic Swiss watch.

This circuit prototype includes two identical branches 10, 20 each including, starting from the supply potential VDD to the supply potential VSS, the series arrangement of a resistive element 8, respectively 9, of an n-MOS transistor 4, respectively 5, and a current source 2, respectively 3. The quartz resonator 6 is connected on the side of the source terminals of transistors 4 and 5 and, in a similar way to the circuit of FIG. 1b, transistors 4 and 5 are connected in a differential configuration, the gate terminal of each transistor being connected to the drain terminal of the other transistor.

As already mentioned, making the differential oscillator circuit of FIG. 1c has not been brought to a successful conclusion for reasons of stability.

If the two sources of the cross-coupled pair are DC separated and capacitively coupled at high frequencies, the structure yields positive feedback only above a given frequency and is thus DC stable. A way to impose a similar biasing current above and below each of the two active transistors has to be found to yield a practical oscillator structure. Several such structures have been identified and are described in the above-mentioned parent U.S. patent application Ser. No. 10/162,714. FIG. 2 shows one of these structures.

The structure depicted in FIG. 2 is, without the crystal resonator and the load capacitance, a well-known relaxation oscillator structure. It has already been proposed in International Application WO 98/48511 in association with an overtone crystal resonator but in a coupled mode where the relaxation is synchronized by the high-Q resonator (cf. also J. R. Westra, C. J. M. Verhoeven and A. H. M. van Roermund, "Resonance-Mode Selection and Crosstalk Elimination Using Resonator-Synchronised Relaxation Oscillators", Proc. ESSCIRC 98, The Hague, The Netherlands, pp. 88–91).

In addition to the aforementioned oscillator circuits, it will be noted that recent developments in the manufacture of bulk acoustic wave resonators (or BAW resonators), offer new opportunities for applications in the field of telecommunications. Electro-mechanical BAW resonators, and more particularly, thin film BAW resonators have considerable advantages, in particular high working frequencies (of the order of 1 to 10 GHz), a high quality factor, reduced size and the possibility of being integrated directly onto the integrated circuit. By way of complementary information concerning BAW resonators, reference could be made to the document by MM. K. M. Lakin, K. T. McCarron and R. E. Rose, "Solidly Mounted Resonators and Filters", 1995 IEEE Ultrasonics Symposium, pp. 905–908.

The possibilities offered by the aforementioned BAW resonators require the development of dedicated circuits making use of all the advantages and excellent properties of these resonators.

SUMMARY OF THE INVENTION

One general object of the present invention is to propose an oscillator circuit based on the principle depicted in FIG. 2 which is in particular suited, but not solely, to high frequency applications.

Another object of the present invention is to propose such an oscillator circuit, which also has good stability and low power consumption.

Another more particular object of the present invention is to propose an oscillator circuit able, in particular, to make use of the advantages and excellent properties of the aforementioned BAW resonators.

The present invention thus concerns a differential oscillator circuit including an electro-mechanical resonator whose features are listed in the independent claim 1.

Advantageous embodiments of the present invention form the subject of the dependent claims.

According to the invention, the differential oscillator circuit includes, in particular, first and second branches each including a series arrangement of a transistor connected via its current terminals and bias means imposing a determined current through the transistor. The transistors are connected, in a similar way to the prior art, in a differential configuration, the control terminal of each transistor being connected to the current terminal of the other transistor having the most positive potential, like the drain terminal of the transistors in the event that the latter are made in MOS technology.

More particularly, according to the invention, the electro-mechanical resonator is connected between the control terminals of the transistors, namely on the side of the current terminals of the transistors having the most positive potential, like the drain terminals of MOS technology transistors. Moreover, a capacitive element is placed between the current terminals of the transistors having the most negative potential, namely the source terminals of MOS transistors.

The various embodiments, which will be described in the following description, are based on MOS technology. Although not explicitly shown, the dual versions of these embodiments (obtained by reversing the supply voltages and the polarities of the transistors) are also deemed to form part of the invention. Furthermore, it will likewise be understood that the present invention is not limited to this specific technology and that the transistors could, if required, be made in bipolar technology.

The invention proposes, for the first time, an efficient solution relying on an oscillator circuit with a differential structure including an electro-mechanical resonator. Unlike the differential resonator of FIG. 1c, which has a stability problem, the oscillator circuit according to the present invention has great stability and essentially behaves like the oscillator circuit of FIG. 1b in proximity to the resonant frequency of the LC tank circuit. The capacitive element placed on the source side with respect to the crossed pair of transistors fixes the frequency below which the stability of the continuous DC component—or negative counter-reaction—dominates, and above which oscillation occurs. In addition, the capacitance value of this capacitive element is selected so that relaxation of the circuit is prevented.

According to the invention, the bias means can regulate the oscillation amplitude if they are placed in a low frequency regulating loop following an amplitude detector.

From the point of view of consumption, the oscillator circuit according to the present invention performs better than the Pierce oscillator illustrated in FIG. 1a, since the load capacitive elements C1 and C2 placed on either side of the Pierce resonator are omitted, according to the present invention, without modifying the behaviour of the circuit and without being detrimental to frequency stability of the oscillator.

BRIEF DESCRIPTION OF THE DRAWINGS

Other features and advantages of the present invention will appear more clearly upon reading the following detailed description, made with reference to the annexed drawings given by way of non-limiting example and in which:

FIG. 1a, which has already been described, shows a diagram of an oscillator circuit with an electro-mechanical resonator, known by the name of a Pierce resonator;

FIG. 1b, which has already been described, shows a diagram of a differential oscillator circuit including an LC tank circuit;

FIG. 1c, which has already been described, shows a diagram of a differential oscillator circuit prototype including an electro-mechanical resonator envisaged for the first electronic Swiss watch;

EMBODIMENTS OF THE INVENTION

Figure 2:
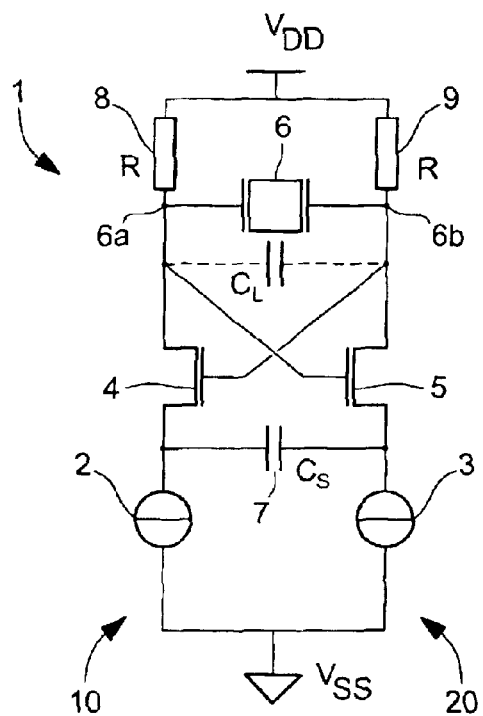
FIG. 2 shows a differential oscillator circuit constituting a first embodiment of the present invention.

FIG. 2 shows a diagram of a differential oscillator circuit, globally indicated by the reference numeral 1, constituting a first embodiment of the present invention.

This differential oscillator circuit 1 includes, generally, first and second branches, respectively designated by the reference numerals 10 and 20, each connected between a high supply potential VDD and a low supply potential VSS. These branches are identical and each include, starting from high supply potential VDD, the series arrangement of a resistive element 8, respectively 9, an n-MOS transistor 4, respectively 5, and a current source 2, respectively 3. More specifically, one of resistive elements 8, 9 is connected between supply potential VDD and the drain of transistor 4, and the other is connected between supply potential VDD and the drain of transistor 5. Likewise, one of current sources 2, 3 is connected between supply potential VSS and the source of transistor 4, and the other is connected between supply potential VSS and the source of transistor 5.

Current sources 2, 3 and resistive elements 8, 9 together form bias means that impose a determined current through transistors 4, 5, which current is the same in the two circuit branches 10 and 20.

Transistors 4, 5 form a crossed pair of transistors. In this configuration, the drain of transistor 4 of first branch 10 is connected to the gate of transistor 5 of the other branch 20 and, symmetrically, the drain of transistor 5 of second branch 20 is connected to the gate of transistor 4 of first branch 10.

According to the invention, differential oscillator circuit 1 further includes an electro-mechanical resonator 6 connected via first and second terminals 6a, 6b between the drains of transistors 4 and 5 of the two branches 10, 20. These first and second terminals 6a, 6b of electromechanical resonator 6 also form the first and second output terminals of the differential oscillator circuit.

This electro-mechanical resonator 6 may be a continuous quartz resonator with high impedance in steady state or, with a view to use for high frequency applications (within a range of the order of 1 to 10 GHz), advantageously a bulk acoustic wave resonator like the BAW resonators mentioned in the preamble or, again, so-called "TFBAR" resonators (Thin Film Bulk Acoustic Resonators).

Differential oscillation circuit 1 according to the invention further includes a capacitive element 7 of capacitance $C_S$ connected between the sources of transistors 4, 5. This capacitive element 7 fixes the frequency below which the DC stabilisation (or negative counter-reaction) dominates and above which oscillation can occur and, depending on its value, whether parasitic relaxation oscillations could occur. Capacitance $C_L$ designates the capacitance seen between the two drains of the cross-coupled n-MOS pair and is indicated here for the purpose of explanation.

Generally, and as will be seen in detail hereinafter with reference to the second embodiment of the present invention, current sources 2, 3 can allow regulation of the oscillation amplitude if placed in a suitable oscillation amplitude regulating loop.

As already mentioned in the preamble, the structure illustrated in FIG. 2 performs better in terms of power consumption than the Pierce oscillator circuit illustrated in FIG. 1a. Indeed, the use of load capacitive elements on either side of the electro-mechanical resonator can be omitted without altering the behaviour or frequency stability of the oscillator.

Figure 3:
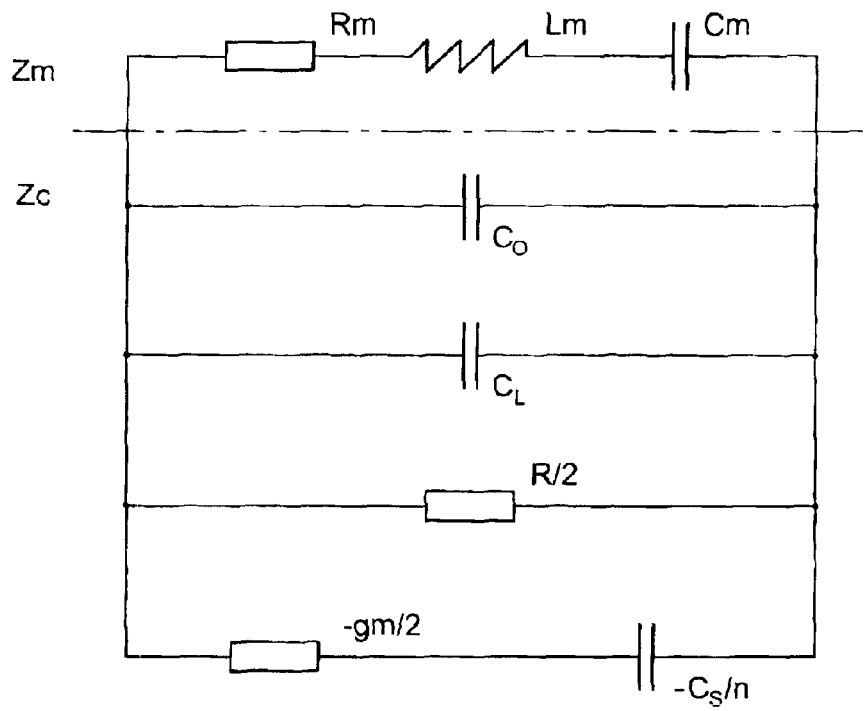
FIG. 3 shows an equivalent small signal circuit of the embodiment of FIG. 2.

A small-signal analysis of the impedance (or admittance) seen outside the motional branch of the crystal oscillator ($R_m$ $L_m$ $C_m$) allows a precise determination of the conditions leading or not to relaxation. With $C_O$ the shunt capacitance of the crystal resonator, $C_L$, $C_S$ the equivalent differential capacitances seen respectively between the two drains and the two sources of the cross-coupled n-MOS pair, gm their transconductance, n the transistor body effect and R, the value of the biasing resistor, the circuit impedance can be computed with the equivalent circuit shown in FIG. 3.

The impedance is again a bilinear function of gm. Thanks to biasing resistors 8, 9, the real part of the impedance is positive at low frequency, hence the stability of the circuit, and drops to negative value yielding gain above a frequency $\omega$ given by expression (1) below:

$$\omega = \frac{n \cdot gm}{2 \cdot C_S} \cdot \sqrt{\frac{1}{gm \cdot R - 1}} \tag{1}$$

The reactance of the circuit is null at a frequency $\omega$ given by the following expression:

$$\omega = \frac{n \cdot gm}{2 \cdot C_S} \cdot \sqrt{\frac{C_S}{n \cdot (C_L + C_O)} - 1} \tag{2}$$

Depending on the value of the different capacitors, it may be appreciated that frequency $\omega$ will have a complex or real root. In particular, frequency $\omega$ will be complex if the following condition is satisfied:

$$C_S < n \cdot (C_L + C_O) \tag{3}$$

If frequency $\omega$ is complex, this then means that the phase can never be null and that relaxation cannot happen. If the value of capacitance $C_S$ in increased beyond the value defined in expression (3) above, there exists a frequency where the phase is null. If the resistance of the circuit is null or negative at this frequency, then all the conditions are satisfied for the circuit to enter relaxation. Accordingly, relaxation of the circuit can be prevented, as a general rule, if the frequency for which the reactance is null has a complex root.

Provided the negative resistance is sufficiently big, oscillations can build up at a frequency $f_{OSC}$ that is:

$$f_{OSC} = \frac{1}{2\pi\sqrt{L_m \cdot C_m}} \cdot \left[1 + \frac{C_m}{2 \cdot (C_O + C_L)}\right] \quad (4)$$

The locus of the impedance in the complex plane as gm is varied for different values of $C_S$ is a family of circles of various radiuses $R_C$ given by:

$$R_C = \frac{1}{2} \cdot \frac{C_S}{n \cdot (C_L + C_O) - C_S} \frac{1}{\omega_0 \cdot (C_L + C_O)} \quad (5)$$

$C_L$ which is equivalent to the load capacitance of the 3-points oscillator should thus be minimized to obtain a large circle and hence a high stability.

Interestingly, if capacitance $C_S$ is chosen so that the circuit reactance is null at $\omega = 0$ (e.g. $C_S = n \cdot (C_L + C_O)$), the circle radius tends towards infinity. If $C_S$ is 80% of that value, and $C_L$ negligible with respect to $C_O$, the circle radius is still four times bigger than the maximum 3-points circle with $C_L = \infty$. Again, when $C_S$ is increased beyond that value, the impedance locus crosses the imaginary axis in the left half plane enabling relaxation. With the circuit of FIG. 2, capacitance $C_S$ should thus preferably be kept between 80% to 100% of its maximum value preventing relaxation.

We will now turn to power consumption issues of the circuit configuration shown in FIG. 2. The summed critical transconductance $gm_c$ necessary to overcome the resonator losses as a function of the resonator Q-factor is independent of $C_S$ and given by:

$$gm_C = 4 \cdot \left[\sqrt{\frac{C_m}{L_m}} \cdot \left(\frac{C_m}{C_O}\right)^{-2} \frac{1}{Q}\right] \cdot \left(1 + \frac{C_L}{C_O}\right)^2 + \frac{1}{R} \quad (6)$$

Assuming 1/R negligible, this value is identical to that of a 3-points oscillator with a similar load capacitance. Minimizing the term in the first bracket is the matter of crystal manufacturers. Consequently, the only way to reduce the oscillator power consumption is to reduce the load over shunt capacitance ratio ($C_L/C_O$). This would intuitively be in contradiction with stability issues. Let us however make a partial derivation of equation (4) to compute the sensitivity of the oscillation frequency to a relative variation of load capacitance $C_L$. It yields:

$$\frac{\Delta f_{OSC}}{f_{OSC}} = \frac{C_m}{2 \cdot C_O} \cdot \frac{C_L}{C_O} \cdot \left(1 + \frac{C_L}{C_O}\right)^{-2} \frac{\Delta C_L}{C_L} = \quad (7)$$

Interestingly, the factor that depends on the $C_L$ over $C_O$ ratio is a symmetrical function of the load over shunt capacitance ratio $C_L/C_O$ (i.e. $f(C_L/C_O) = f(C_O/C_L)$). In other words, the improved stability that is obtained by choosing a large loading capacitance $C_L$ (at the expense of a serious increase in the power consumption) can also be achieved without any penalty in terms of power consumption if the inverse $C_L$ over $C_O$ ratio can be attained. Let us for instance consider a ratio $C_L/C_O$ of 3 or ⅓, the stability is the same but there is a difference in terms of power consumption of a factor 10.

In the 3-points oscillator structure, load capacitance $C_L$ is a functional element and a reduction of its value leads to a reduction of the impedance circle in the complex plane which could prevent oscillations if $C_L$ turns to be too small.

In the differential oscillator structure of FIG. 2 however, the effect is opposite. If the load capacitance $C_L$ is reduced, both the stability and the power consumption are improved as demonstrated hereinabove. Within the scope of the present invention, the load capacitance $C_L$ can thus be reduced to parasitics, i.e. that of the PCB, of the IC pad, of its ESD protection device and of the junctions and gates of the transistors.

The differential oscillator structure presented in FIG. 2 for analysis purposes suffers however from some drawbacks. A first drawback resides in that the biasing resistors 8, 9 should be prohibitively large not to deteriorate the resonator quality factor Q. Another drawback resides in the fact that the oscillator common mode voltage depends linearly on the current drawn by the bottom current sources 2, 3, thus limiting the maximum start-up current. Those drawbacks can be avoided with the structure shown in FIG. 4.

In that implementation, the biasing resistors are replaced by two current sources comprising p-MOS transistors M8 and M9 (which are part of a current mirror comprising transistors M7, M8, M9). The bottom current sources are replaced by n-MOS transistors M3 and M4 whose gate terminals are connected to the resonator terminals 6a, 6b. Transistors M3, M4 work in the triode region as current followers forcing the current delivered by transistors M8, M9 across the cross-coupled pair M1, M2 (which correspond to transistors 4, 5 in FIG. 2).

Owing to the symmetry of the structure and its DC stability, the common mode voltage at the quartz ports 6a, 6b before oscillations build-up is simply the one that would appear across a diode-connected stack of two transistors identical to that of one branch. This is exploited to realise the degenerated current mirror M5, M6 which together with transistors M1 to M4, M7 to M9, and resistors R16, R17 and RPTAT (resistor R1 and capacitor C1) form an amplitude regulation loop inspired from the one found in some 3-points quartz oscillators. Alternatively, native transistors having a threshold voltage $V_T$ close to zero and operating in the sub-threshold region may be used instead of resistors R16, R17 for the extraction of the oscillator common mode voltage so that they can be biased without requiring a gate voltage higher than the channel one.

Figure 4:
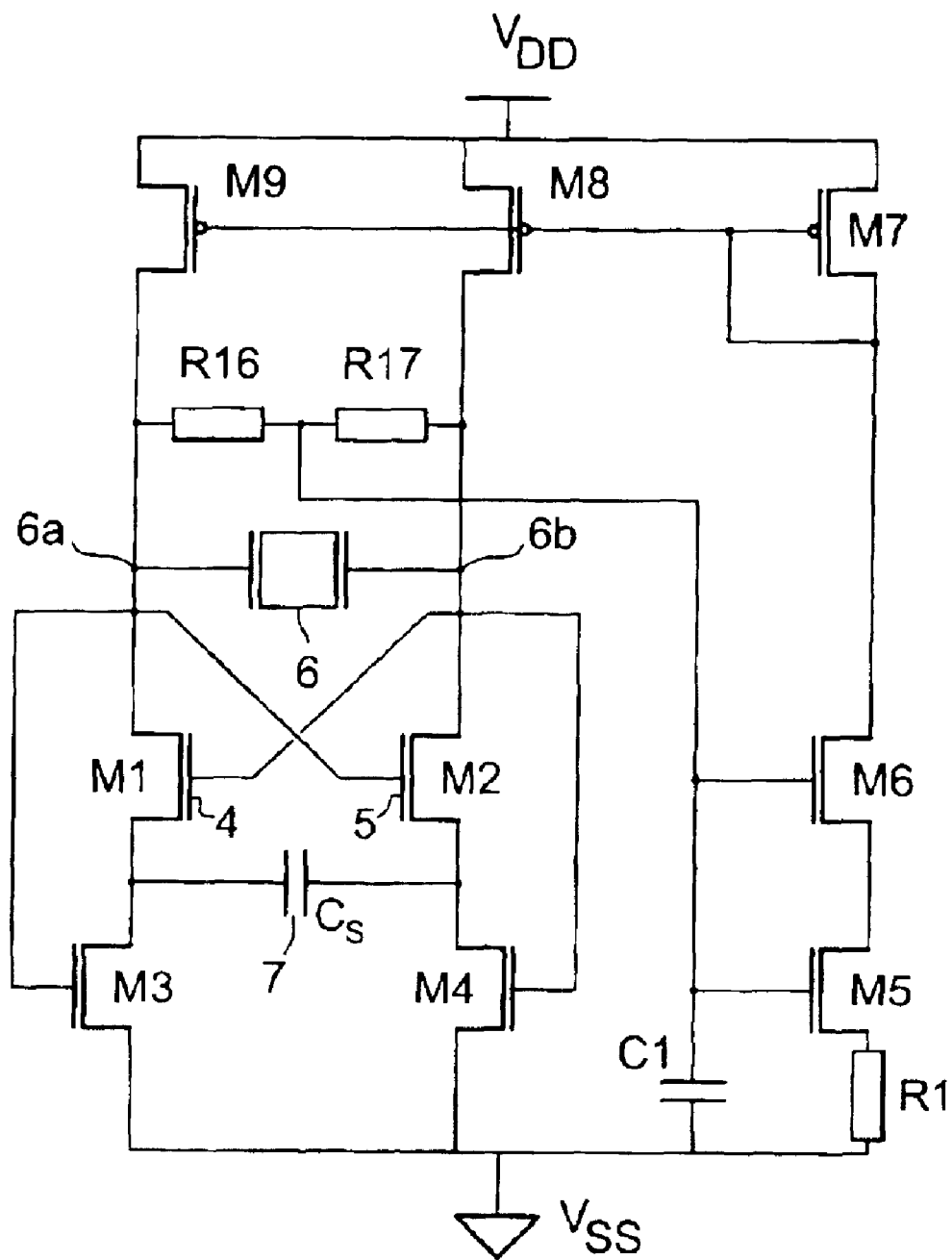
FIG. 4 shows a differential oscillator circuit constituting an improved variant of the first embodiment of FIG. 2.

An analysis of the impedance presented by the circuit of FIG. 4 leads to the criteria preventing relaxation. While the impedance is not a bilinear function of transconductance gm anymore, its locus remains close to a circle and the "radius" is still dependant on $C_S$ and can thus also be made rather large even if $C_S$ is controlled within 20% tolerance. Consequently, all the advantages derived for the structure presented in FIG. 2 are preserved.

The condition on $C_S$ that is to be met so that relaxation of the circuit does not occur is slightly different than that given in expression (3) above in connection with the structure of FIG. 2:

$$C_S < n/2 \cdot (C_L + C_O)(1 + S3/S1)^2 \quad (3)$$

where S3 and S1 are respectively the number of transistors forming transistor M3 and transistor M1 (transistors M2 and M4 being identical to transistors M1 and M3 respectively and the number of transistors forming M3/M4 being greater than M1/M2 or DC stability reason (real part of impedance positive at DC)).

The general rule stated above is however still applicable, namely capacitance $C_S$ has to be chosen so that the reactance of the circuit does not have any real zero (but a complex zero). In any case, for each structure, there is a value for capacitance $C_S$ which corresponds to the circuit reactance being null at a frequency equal to zero ($\omega=0$). This determines a maximum value for $C_S$, which should not be exceeded in order to prevent relaxation of the circuit. The value of capacitance $C_S$ should be chosen as close as possible to this maximum, taking account of the tolerances on capacitances $C_L$ and $C_O$, so as to maximize the "radius" of the impedance locus.

It will be understood that various modifications and/or improvements obvious to those skilled in the art can be made to the embodiment described in the present description without departing from the scope of the invention defined by the annexed claims. Thus, as already mentioned, the differential oscillator circuit according to the present invention could perfectly well be made in bipolar technology.

What is claimed is:

1. A differential oscillator circuit including first and second branches each connected between a high supply potential and a low supply potential, said first branch including, arranged in series:

a first transistor having a control terminal, a first current terminal placed on the side of said high supply potential and a second current terminal placed on the side of said low supply potential; and first bias means for imposing a determined current through the first and second current terminals of the first transistor, said second branch including, arranged in series:

a second transistor having a control terminal, a first current terminal placed on the side of said high supply potential and a second current terminal placed on the side of said low supply potential; and second bias means for imposing said determined current through the first and second current terminals of the second transistor, said first and second transistors being connected in a differential configuration, the first current terminal of the first transistor, respectively of the second transistor, being connected to the control terminal of the second transistor, respectively of the first transistor, wherein said differential oscillator circuit further includes:

an electro-mechanical resonator connected via first and second terminals between the first current terminal of the first transistor and the first current terminal of the second transistor, said first and second terminals of the electro-mechanical resonator forming first and second output terminals of the differential oscillator circuit; and a capacitive element of determined capacitance value which is connected between the second current terminal of the first transistor and the second current terminal of the second transistor, the capacitance value of said capacitive element being selected so as to be less than a maximum value above which relaxation of the oscillator circuit can occur.

2. The differential oscillator circuit according to claim 1, wherein said maximum value is defined as the value for which reactance of the oscillator circuit is null at a null frequency.

3. The differential oscillator circuit according to claim 1, wherein said capacitance value of the capacitive element is selected to be close to said maximum value, preferably between 80% and 100% of said maximum value.

4. The differential oscillator circuit according to claim 1, wherein a ratio between a capacitance value $C_L$ seen between the first current terminals of said first and second transistors and a shunt capacitance $C_O$ of said electro-mechanical resonator is minimized.

5. The differential oscillator circuit according to claim 4, wherein said capacitance value $C_L$ seen between the first current terminals of said first and second transistors is reduced to parasitics.

6. The differential oscillator circuit according to claim 1, wherein said first bias means include a first current source connected between the second current terminal of said first transistor and said low supply potential and a first resistor means connected between the first current terminal of said first transistor and said high supply potential, and wherein said second bias means include a second current source connected between the second current terminal of said second transistor and said low supply potential and a second resistor means connected between the first current terminal of said second transistor and said high supply potential.

7. The differential oscillator circuit according to claim 1, wherein said first bias means include a first current source connected between the first current terminal of said first transistor and said high supply potential and a third transistor comprising a control terminal and first and second current terminals which are respectively connected to the first terminal of said first transistor, the second terminal of said first transistor and said low supply potential, and wherein said second bias means include a second current source connected between the first current terminal of said second transistor and said high supply potential and a fourth transistor comprising a control terminal and first and second current terminals which are respectively connected to the first terminal of said second transistor, the second terminal of said second transistor and said low supply potential.

8. The differential oscillator circuit according to claim 7, wherein said first and second current sources are respectively fifth and sixth transistors each comprising a control terminal and first and second current terminals and forming part of a current mirror, the first current terminals of said fifth and sixth transistors being connected to said high supply potential, the second current terminal of said fifth transistor, respectively of said sixth transistor, being connected to the first terminal of said first transistor, respectively of said second transistor.

9. The differential oscillator circuit according to claim 8, further including an amplitude regulation loop connected to the terminals of said electro-mechanical resonator to enslave the current delivered by the current mirror comprising said fifth and sixth transistors.

10. The differential oscillator circuit according to claim 9, wherein said amplitude regulation loop includes two resistor means connected in series between the terminals of the electro-mechanical resonator.

11. The differential oscillator circuit according to claim 10, wherein said two resistor means are native transistors having a threshold voltage close to zero and operating in the sub-threshold region.

12. The differential oscillator circuit according to claim 10, wherein a connection node between said two resistor means is coupled to means for regulating the current delivered by said current mirror.

13. The differential oscillator circuit of claim 1, wherein said oscillator circuit is realized in CMOS technology.

14. The differential oscillator circuit of claim 1, wherein said electro-mechanical resonator is a bulk acoustic wave resonator.

* * * * *